(12) United States Patent
Ibrahimovic et al.

(10) Patent No.: US 9,400,308 B2
(45) Date of Patent: Jul. 26, 2016

(54) MULTI-DOMAIN HETEROGENEOUS PROCESS-VOLTAGE-TEMPERATURE TRACKING FOR INTEGRATED CIRCUIT POWER REDUCTION

(71) Applicant: QUALCOMM Incorporated, San Diego, CA (US)

(72) Inventors: Jasmin Smaila Ibrahimovic, San Diego, CA (US); Mohammad Reza Kakoee, San Diego, CA (US); Shih-Hsin Jason Hu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 125 days.

(21) Appl. No.: 14/323,652

(22) Filed: Jul. 3, 2014

(65) Prior Publication Data
US 2016/0003893 A1   Jan. 7, 2016

(51) Int. Cl.
| G01R 31/00 | (2006.01) |
| G01R 31/28 | (2006.01) |
| G06F 1/26 | (2006.01) |
| G06F 1/32 | (2006.01) |

(52) U.S. Cl.
CPC .............. *G01R 31/2851* (2013.01); *G06F 1/26* (2013.01); *G06F 1/3203* (2013.01); *G06F 1/3206* (2013.01); *G06F 1/3287* (2013.01); *G06F 1/3296* (2013.01)

(58) Field of Classification Search
CPC .......................... B81B 3/0021; G01N 33/0032
USPC ....................... 324/537, 609, 76.11
See application file for complete search history.

(56) References Cited

U.S. PATENT DOCUMENTS

| 7,525,373 B1* | 4/2009 | Ogilvie et al. ................. 327/564 |
| 7,739,626 B2 | 6/2010 | Jin et al. |
| 7,818,590 B2 | 10/2010 | Yang |
| 7,921,312 B1 | 4/2011 | Pennanen et al. |
| 8,441,310 B2 | 5/2013 | Senthinathan et al. |
| 2003/0122429 A1 | 7/2003 | Zhang et al. |
| 2008/0297233 A1 | 12/2008 | Tokunaga |
| 2013/0135994 A1* | 5/2013 | Michel et al. ................. 370/229 |

OTHER PUBLICATIONS

International Search Report and Written Opinion—PCT/US2015/030997—ISA/EPO—Aug. 6, 2015.

* cited by examiner

*Primary Examiner* — Vincent Q Nguyen
(74) *Attorney, Agent, or Firm* — Procopio, Cory, Hargreaves & Savitch LLP

(57) ABSTRACT

The systems and method described herein provide efficient (e.g., low power and low area) techniques to track performance in numerous supply domains with heterogeneous circuits that are used in a large system-on-a-chip integrated circuit (SoCs). The heterogeneous circuits can include circuits made with different devices, different cell libraries, and different hard macros that are in different power supply domains. Performance measurements from performance sensors (or process-voltage-temperature (PVT) sensors) that are spread about the SoC are collected and processed to determine voltage levels for each of the supply domains. A single controller can receive can determine voltage levels for a whole SoC. The performance sensors are connected to the controller by a scan chain. The techniques are flexible and can be easily adapted for use in SoCs with different power supply domains and types of circuits.

30 Claims, 5 Drawing Sheets

MULTI-DOMAIN HETEROGENEOUS PROCESS-VOLTAGE-TEMPERATURE TRACKING FOR INTEGRATED CIRCUIT POWER REDUCTION

BACKGROUND

1. Field

The present invention relates to integrated circuits and, more particularly, to systems and methods for power reduction using multi-domain heterogeneous process-voltage-emperature tracking.

2. Background

The increased use of mobile, battery-powered devices has increased the importance of reducing power consumption in large heterogeneous system-on-a-chip integrated circuits (SoCs). Among the techniques to achieve power reductions, dynamically adjusting supply voltage based on tracking process, temperature, and voltage drop is highly effective since reducing supply voltage can significantly reduce both dynamic and static power of an SoC.

However, in large SoCs with many millions of transistors on a single die, there are several supply domains that can have independent voltage levels. Additionally, an SoC can have a number of heterogeneous devices, for example, transistors with different threshold voltages (Vth) and channel lengths, with each type of device having its own performance and power attributes. Dynamically adjusting supply voltages for a whole SoC can also be very difficult due to the use of (1) different technology library implementations such as high-speed and high-density; (2) different supply domains with different configurations of voltage regulators (e.g., using a switching mode power supply (SMPS) or low drop-out (LDO) regulator); and (3) a variety of hard macros that can each have a different supply domain and independent power controls.

Limitations of prior approaches include high complexity, difficult to adapt to new designs, cost (power and chip area), and lost performance. A prior approach to track all these supply domains with heterogeneous hard macros and technology library implementations is Process Voltage Scaling (PVS). This is a traditional approach that determines the process conditions of the die. It is based on binning using Fmax (maximum operating frequency) vectors during production testing. Limitations of PVS include: not able to track temperature; high cost of test time; process binning is coarse grained; difficult to track heterogeneous domains and hard macros; determining a good Fmax vector on complex SoCs is very difficult; and cannot compensate for board-level drops on supply voltages.

A second prior approach to track all these supply domains with heterogeneous hard macros and technology library implementations is open loop voltage adjustment using process monitors where several PVT (process, voltage, temperature) monitors can be placed in each supply domain and read during chip testing to determine the die process conditions (e.g., slow, nominal, fast). The appropriate voltage for each supply domain can be stored (e.g., by blowing fuses) during the testing process based on measurements from the process monitors. This approach, compared to PVS, has better test time and less complexity, does not need Fmax vectors, and can be used with heterogeneous domains. Limitations of this second prior approach include that it can only track process variation and thus requires added margins (that reduce device performance) for temperature and other factors.

A third prior approach to track all these supply domains with heterogeneous hard macros and technology library implementations combines the process monitors of the above approach with PVT monitors and uses a central controller for each supply domain and each device type to dynamically adjust voltage during operation of the SoC. This approach can lower power consumption of the open-loop approaches due to the additional supply voltage adjustments. However, this approach needs PVT monitors in each power and supply domain and a central controller per each supply domain or sub-regulated domain and per each library implementation type. These central controllers read the data of PVT monitors, interpret the data, and send voltage recommendations for their domains to an arbiter (e.g., a hardware or software based power management integrated circuit (PMIC) controller).

Limitations of this third approach include the power and area overhead due to the use of multiple central controllers—for each supply domain and each library implementation. This overhead can be very large since the number of supply domains in complex SoCs is large. The overhead could wipe out the power savings. Also, this approach is also complex. For example, managing the supply voltage in just a single supply domain with different technology library implementations and with different device types is difficult.

SUMMARY

In one aspect, an integrated circuit is provided that includes: a plurality of performance sensors configured to measure performance of circuitry in the integrated circuit, wherein at least one of the plurality of performance sensors is connected to each of a plurality of supply domains in the integrated circuit; and a core power reduction (CPR) controller module coupled to the plurality of performance sensors and configured to collect performance measurements from the plurality of performance sensors by sequentially receiving the performance measurement from each of the plurality of performance sensors, and assigning each of the performance measurements to one of a plurality of categories; and process the performance measurements to determine target voltage levels for each of the plurality of supply domains.

In one aspect, an integrated circuit is provided that includes: a plurality of performance sensors configured to measure performance of circuitry in the integrated circuit, wherein the plurality of performance sensors are connected to at least one supply domain in the integrated circuit, and wherein the plurality of performance sensors include sensors for heterogeneous circuits that have different relationships between supply voltage and circuit speed; and a core power reduction (CPR) controller module coupled to the plurality of performance sensors and configured to collect performance measurements from the plurality of performance sensors by sequentially receiving the performance measurement from each of the plurality of performance sensors, and assigning each of the performance measurements to one of a plurality of categories; and process the performance measurements to determine a target voltage level for the at least one supply domain.

In one aspect, method is provided for use in controlling supply voltages for multiple supply domains to reduce power in an integrated circuit. The method includes: measuring circuit performance in the multiple supply domains using a plurality of heterogeneous performance sensors; collecting performance measurements by sequentially receiving the performance measurement from each of the plurality of heterogeneous performance sensors, and assigning each of the performance measurements to one of a plurality of categories; and processing the performance measurements to determine target levels for the supply voltages.

In one aspect, an apparatus is provided that includes: a plurality of means for sensing performance of circuitry in the integrated circuit, wherein at least one of the plurality of means for sensing performance is connected to each of a plurality of supply domains in the integrated circuit, and wherein the plurality of means for sensing performance include sensors for heterogeneous circuits that have different relationships between supply voltage and circuit speed; and a means for controlling voltages of the plurality of supply domains configured to collect performance measurements from the plurality of means for sensing performance by sequentially receiving the performance measurement from each of the plurality of means for sensing performance, and assigning each of the performance measurements to one of a plurality of categories; and process the performance measurements to determine a target voltage level for each of the plurality of supply domains.

Other features and advantages of the present invention should be apparent from the following description which illustrates, by way of example, aspects of the invention.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

Figure 1:
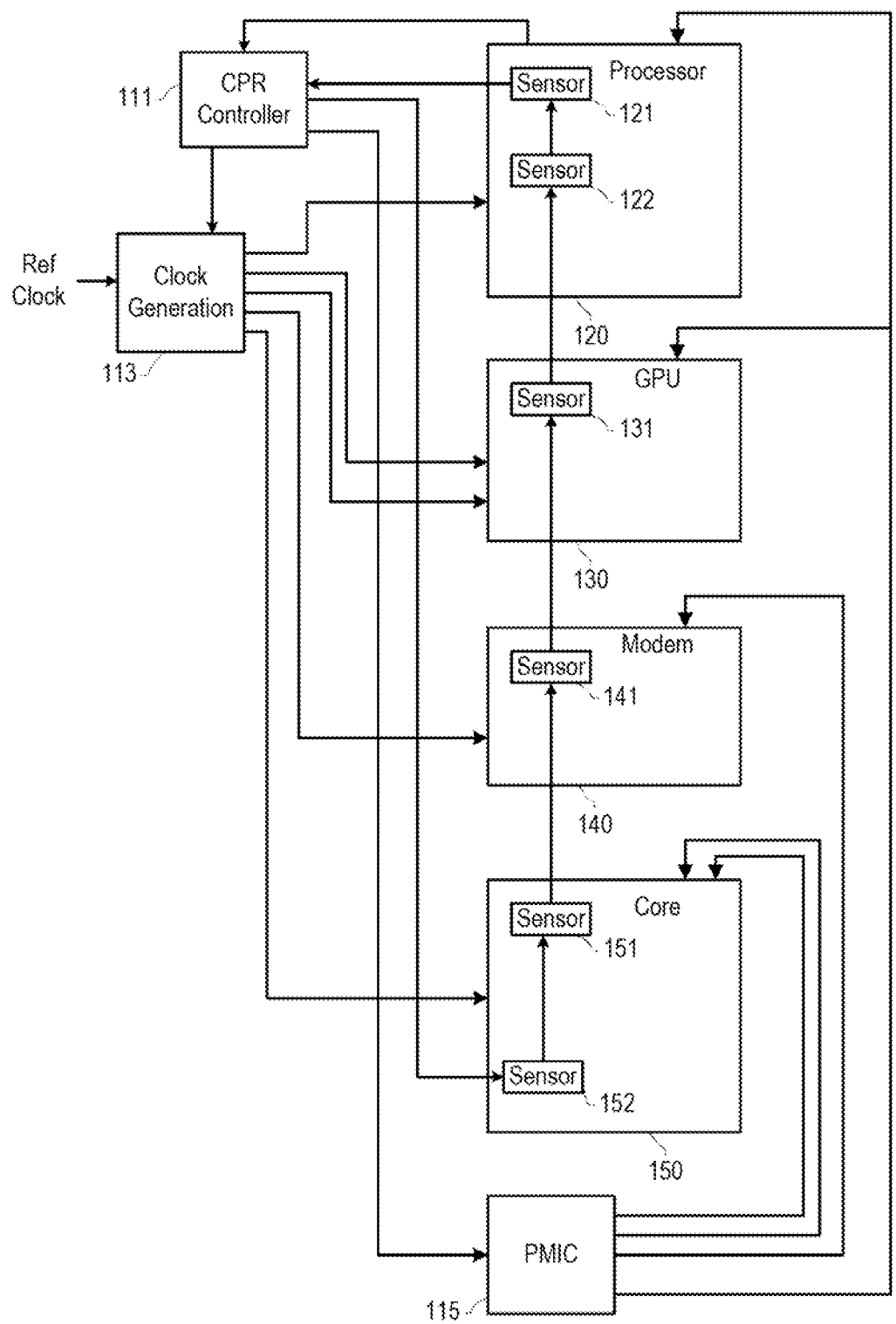
FIG. 1 is a functional block diagram of an electronic system with multi-domain heterogeneous process-voltage-temperature tracking according to a presently disclosed embodiment.

FIG. 1 is a functional block diagram of an electronic system with multi-domain heterogeneous process-voltage-temperature tracking according to a presently disclosed embodiment. Multi-domain refers to the system using multiple supply domains that can have independent voltage levels. Heterogeneous refers to the system including disparate types of circuits. Process-voltage-temperature tracking refers to the system adjusting parameters, such as supply voltages, to track changes in process, voltage, and temperature (which are major influences on circuit performance) or other conditions. The system may be implemented using one or multiple integrated circuits. The system may be, for example, used in a mobile phone.

The system includes various modules that perform operational functions for the system. The example system illustrated in FIG. 1 includes a processor module 120, a graphics processing unit (GPU) 130, a modem module 140, and a core module 150. The processor module 120 can provide general programmable functions; the graphics processing unit 130 can provide graphics functions; the modem module 140 can provide communications functions, for example, wireless communications according to long term evolution (LTE) or code division multiple access (CDMA) protocols; and the core module 150 can provide various functions that are not provided by the other modules.

A clock generation module 113 receives a reference clock input and supplies one or more one clock signals to the other modules. The clock generation module 113 may include phase locked loops and dividers to supply the clock signals at various frequencies. The clock generation module 113 supplies the clocks to the other modules at frequencies controlled by a core power reduction controller module 111. All or parts of the functions of the clock generation module 113 may be located in the various modules that use the clock signals.

A power management integrated circuit (PMIC) 115 supplies one or more voltages to the other modules in the system. The PMIC 115 may include switching voltage regulators and low-dropout regulators. The PMIC 115 may be a separate integrated circuit. The voltages supplied by the PMIC 115 are also controlled by the core power reduction controller module 111. Modules of the systems may have one voltage supply, multiple voltages supplies (e.g., the core module 150), or multiple modules may operate with a common voltage supply (e.g., the processor module 120 and a GPU module 130). Additionally, a module may include a sub-domain that uses a supply voltage that is regulated from another supply voltage. For example, the sub-domain voltage may be regulated down from domain voltage using an LDO regulator or the sub-domain voltage may be switched off to save power from circuits in the sub-domain.

The processor module 120, the graphics processing unit 130, the modem module 140, and the core module 150 include performance sensors. In the example system of FIG. 1, the processor module 120 includes two performance sensors 121, 122; the graphics processing unit 130 includes a performance sensor 131; the modem module 140 includes a performance sensor 141; and the core module 150 includes two performance sensors 151, 152. Each of the performance sensors includes circuitry to measure circuit speed. For example, the performance sensors may count oscillations of ring oscillators. The performance sensors measure performance characteristics of circuitry in the sensor. Although the performance of circuitry in an integrated circuit may vary with location, temperature, voltage drop, and other parameters, performance measured by a performance sensor can be used to estimate performance of similar circuitry near the performance sensor.

The performance sensors are heterogeneous, that is, they provide measurements for different types of circuits (those with different relationships between circuit speed and supply voltage). For example, performance sensor 121 in the processor module 120 may provide measurements for circuits built using high-speed transistors and performance sensor 122 in the processor module 120 may provide measurements for circuits built using low-leakage transistors. For another example, performance sensor 151 and performance sensor 152 in the core module 150 may provide measurements for circuits operating in different supply domains.

The core power reduction controller module 111 generally operates to reduce power in the electronic system. Although the core power reduction controller module 111 shares the word 'core' with the core module 150, effects of the core power reduction module 111 are not limited to the core module 150. Additionally, the core power reduction module 111 may operate to affect other characteristics of the electronic system; for example, the core power reduction module 111 may operate to increase the operating frequency of the electronic system.

The core power reduction module 111, in the illustrated embodiment, controls the clock frequencies and the supply voltages used by the modules in the system. The core power reduction controller module 111 may, for example, control the frequencies and voltages based on an operating mode selected by the processor module 120. The core power reduction controller module 111 can determine the supply voltages based on performance measurements from the performance sensors in the corresponding modules. The core power reduction controller module 111 can determine the supply voltages so that they equal or only slightly exceed (e.g., 10 mV) the minimum voltages needed for a selected operating frequency.

In other embodiments, the core power reduction controller module 111 may control just the supply voltages or just the clock frequencies. The core power reduction controller module 111 may alternatively or additionally control other system parameters. For example, the core power reduction controller module 111 may control temperature (cooling) or body biases of transistors (adaptive body biasing).

Prior systems have operated with dynamic voltage control or have used multiple controllers for different domains and types of circuits. These systems can be complex to develop and consume excess power, for example, due to voltage supplies being set to higher voltages than needed for a given operating condition.

The systems and method described herein provide efficient (e.g., low power and low area) means to track performance in numerous supply domains with heterogeneous hard macros, devices, and cell libraries that are used in a large SoC. Measurements from performance sensors (or process-voltage-temperature (PVT) sensors) that are spread about the SoC are collected and processed to determine voltage levels for each of the supply domains. The technique is flexible and can be easily adapted for use in SoCs with different power supply domains and types of circuits.

Figure 2:
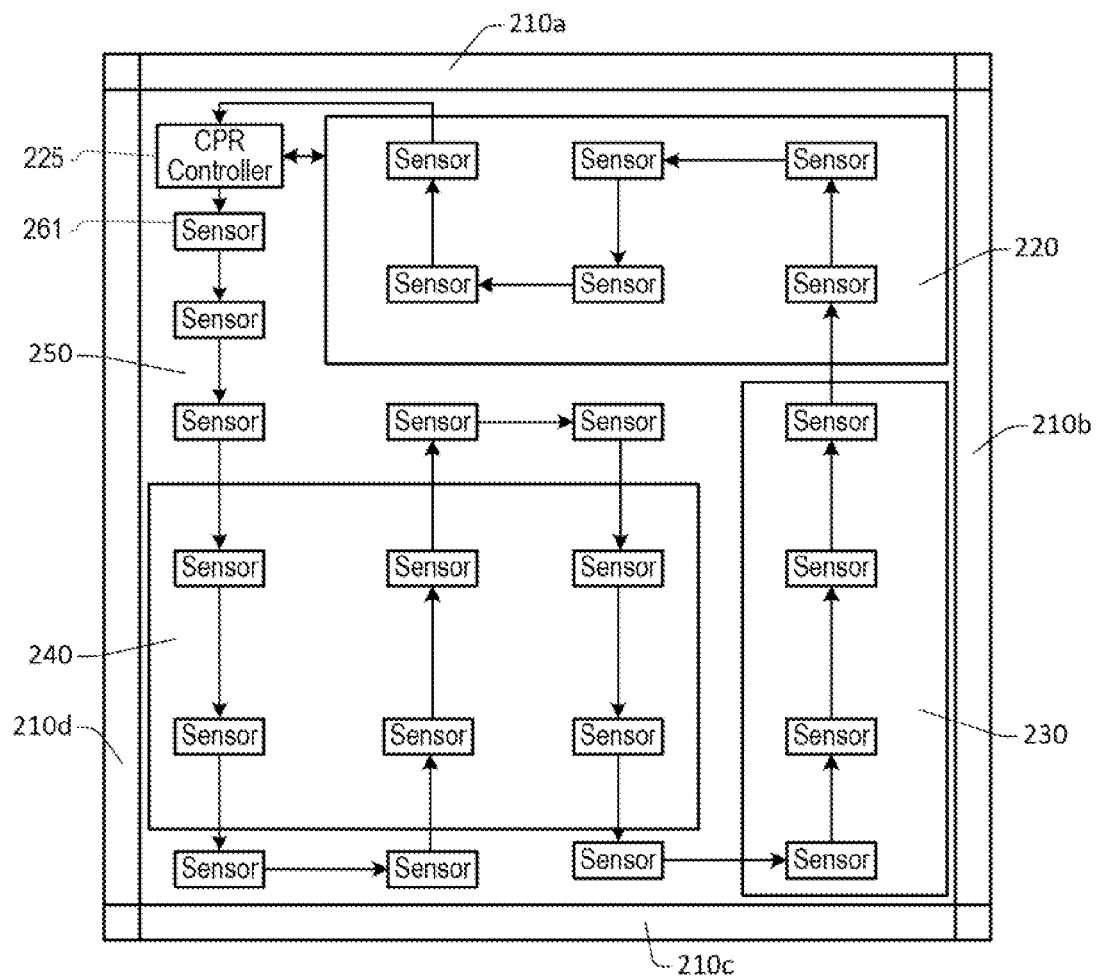
FIG. 2 is a block diagram illustrating layout of an integrated circuit with multi-domain heterogeneous process-voltage-temperature tracking according to a presently disclosed embodiment.

FIG. 2 is a diagram illustrating layout of an integrated circuit with multi-domain heterogeneous process-voltage-temperature tracking according to a presently disclosed embodiment. The integrated circuit may be used to implement the electronic system of FIG. 1. The integrated circuit may be, for example, fabricated using a complementary metal-oxide-semiconductor (CMOS) process.

The integrated circuit of FIG. 2 includes four periphery blocks 210 (210a, 210b, 210c, and 210d) located along the edges of the integrated circuit. The integrated circuit includes a processor module 220, a graphics processing module 230, and a modem module 240 that are large blocks internal to the integrated circuit. Other functions of the integrated circuit, such as those provided by the core module 150 in the system of FIG. 1, may be spread throughout remaining ("core") areas 250 of the integrated circuit. The core power reduction controller module 225, in the embodiment of FIG. 2 is implemented in the remaining areas 250 of the integrated circuit.

The integrated circuit also includes performance sensors 261 that are spaced throughout the integrated circuit area. Although FIG. 2 illustrates twenty-four performance sensors, an integrated circuit implementation may include many hundreds of performance sensors. The performance sensors are connected in a scan chain to the core power reduction controller module 225. The performance sensors may be chained in a zigzag pattern. Additionally, the chain of performance sensors for a module may be contiguous (or mostly contiguous) so the module can be powered down and those performance sensors bypassed as a block. For example, the performance sensors in the processor module 220 may be bypassed by coupling the output of scan chain of performance sensors in graphics processing module 230 directly to the core power reduction controller module 225. Circuitry in the performance sensors 261, or other circuitry, may perform the bypass of a block. Individual performance sensors may also be bypassed.

Figure 3:
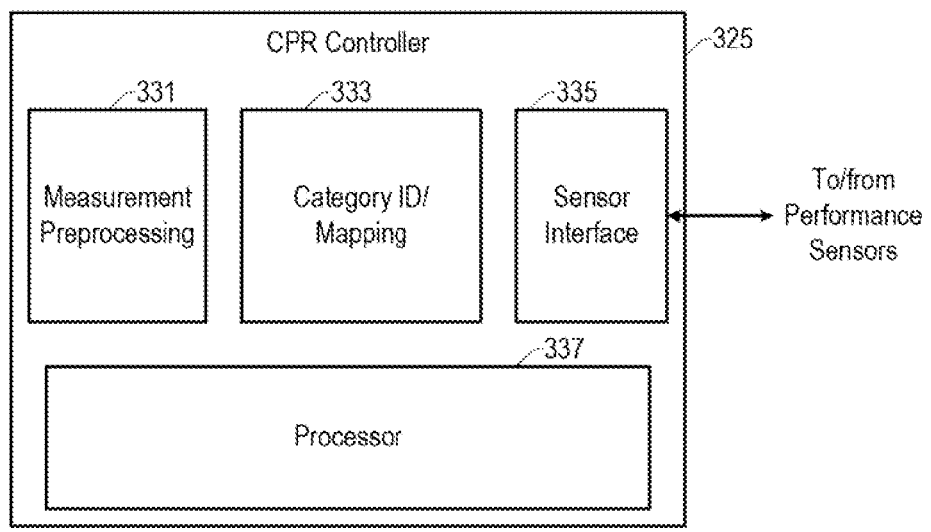
FIG. 3 is a functional block diagram of a core power reduction controller according to a presently disclosed embodiment.

FIG. 3 is a block diagram of a core power reduction (CPR) controller module 325 according to a presently disclosed embodiment. The CPR controller module may be used to implement the core power reduction controller module 111 in the system of FIG. 1 and the core power reduction controller module 225 in the integrated circuit of FIG. 2.

The CPR controller module includes a sensor interface module 335 to communicate with performance sensors. Communication with the performance sensors includes supplying controls for various sensor modes (e.g., what type of measurement will be made or bypassing the sensor) and receiving performance measurements from the sensors. The sensor interface module 335 can be implemented, for example, using a finite state machine.

A category identifier/mapping module 333 determines a category for each sensor measurement received via the sensor interface module 335. The categories are for a certain type of sensor and supply domain. For example, the performance measurements for cells from a high-speed library in a first supply domain and the performance measurements for cells from a high-density library in the first supply domain are kept in separate categories (sometimes referred to as buckets). Additionally, the performance measurements for cells from the high-speed library in the first supply domain and the performance measurements and for cells from the high-speed library in a second supply domain are kept in separate categories. The mapping to categories can be based, for example, on a sensor identifier or the location of the sensor on the scan chain.

The measurement preprocessing module 331 can perform initial processing of the measurements. For example, a worst-case measurement can be determined. When the measurements are counts of ring oscillators, the measurement preprocessing module 331 may keep just the smallest value, which is the worst-case (slowest) measurement. Preprocessing is performed category by category to produce a category performance measurement for each category. The preprocessing can be performed while the measurements are scanned. This can speed analysis of measurements and reduce the amount of processing (e.g., by reducing many measurements to one worst-case value) after collection of the measurements is completed.

A CPR processor module 337 receives the preprocessed measurements and determines target voltage levels for each supply domain. The target voltage levels can then be signaled, for example, to a PMIC to adjust its output voltages. The processor may be multi-threaded, e.g., with one processing thread per domain or category. The CPR processor functions may be provided by other modules, for example, the processor module 120 in the system of FIG. 1 or the processor module 220 in the integrated circuit of FIG. 2.

The CPR processor module 337 can perform many different analyses of the measurement results. The CPR processor module 337 can, for example, for a supply domain with multiple types of devices or library cells, aggregate the results of two or more types of performance measurements and provide a single determination for the voltage for that domain. The CPR processor module 337 may determine voltage levels (including supply domains with heterogeneous circuits) for multiple domains at the same time. For example, the CPR processor module 337 can control voltages for a parent domain and child sub-domain. The child sub-domain is sub-regulated, for example, by an LDO regulator, from the parent domain. The CPR processor module 337 can aggregate measurement results from the parent and child domains to determine voltages for each domain.

Figure 4:
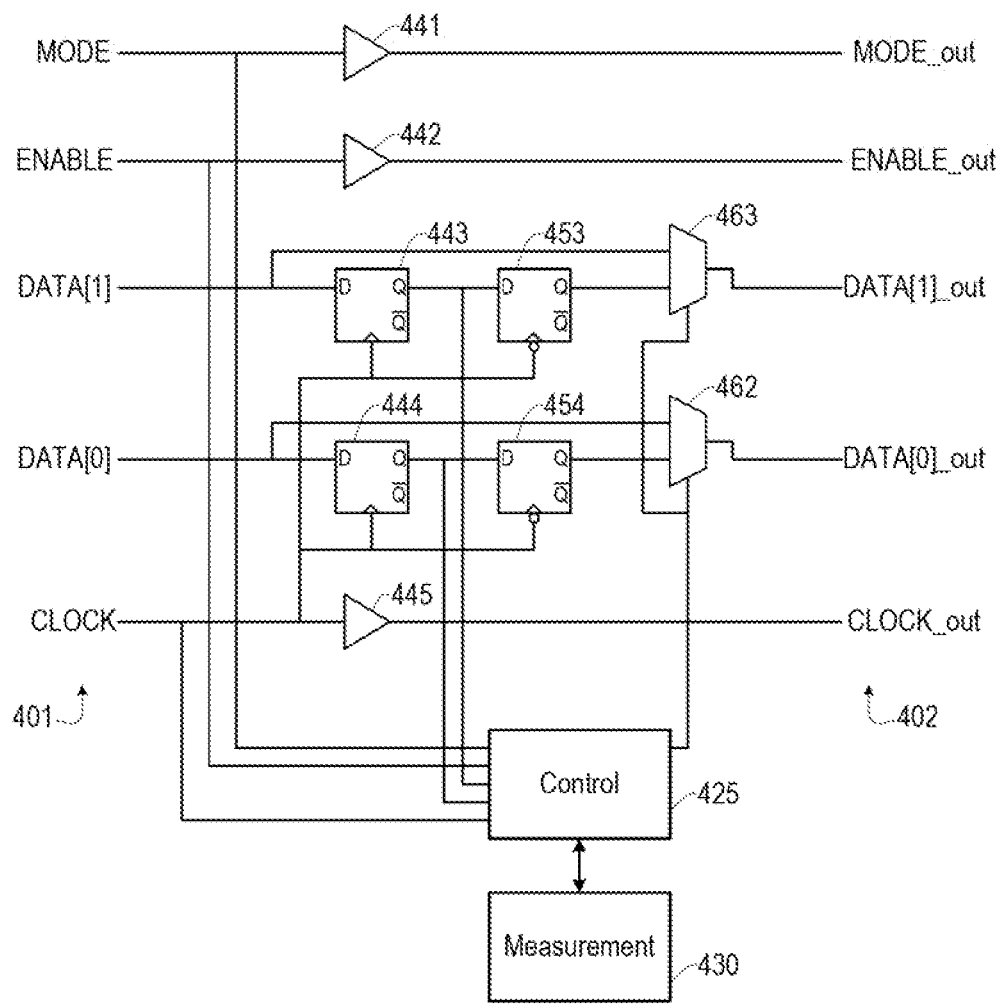
FIG. 4 is a functional block diagram of aspects of a performance sensor according to a presently disclosed embodiment.

FIG. 4 is a functional block diagram of aspects of a performance sensor according to a presently disclosed embodiment. The performance sensor may be used to implement the performance sensors (121, 122, 131, 141, 151, 152) of FIG. 1 and the performance sensors 261 of FIG. 2. The performance sensor receives signals from a prior performance sensor on the scan chain (or a CPR controller module) on an input interface 401 and supplies signals to a subsequent performance sensor on the scan chain (or a CPR controller module) on an output interface 402. In the embodiment of FIG. 4, each interface includes a mode signal, an enable signal, a clock signal, and a 2-bit data signal. Wider or narrower data signals may be used in other embodiments.

The performance sensor of FIG. 4 includes a measurement module 430 that has one or more circuits to measure circuit performance, for example, by operating ring oscillators to produce outputs whose frequencies are indicative of circuit performance. The measurement module 430 may measure performance of different types of circuits, for example, circuits with different transistor types or different types of cell libraries.

The performance sensor includes a control module 425 that provide control logic for the performance sensor. The control module 425 may include counters to count oscillations of the outputs from the measurement module 430. The counters can count for a known time period to measure frequencies of oscillators in the measurement module 430.

The control module 425 decodes signals received on the input interface 401. The control module 425 can, for example, control modes (e.g., idle, measuring, shifting out results, or bypassed) based on the values of the mode and enable signals. The control module 425 also controls the signals on the output interface 402, for example, to supply measurement results.

The interface signals use source synchronous timing so that the timing requirements of the signals can be easily met. The input data signals are latched in flip-flops 443, 444 on rising edges of the clock signal. The output data signals transition on falling edges of the clock signal by being latched in flip-flops 453, 454 on falling edges of the clock signal. Thus the setup and hold times of the data signals relative to the clock signal are approximately one-half of the clock period. When the performance sensor is bypassed, multiplexers 462, 463 select the data input signals to drive on the data output signals directly. Buffers 441, 442, 445 receive the mode signal, the enable signal, and the clock signal on the input interface 401 and drive the corresponding signals on the output interface 402. The buffers 441, 442, 445 help maintain essentially the same timing relationship between the interface signals at each location in the chain of performance sensors.

Portions of the performance sensor may operate in different supply domains. For example, the measurement module 430 can be connected to the supply voltage of the module in which the particular performance sensor is located and other portions of the performance sensor can be on a supply voltage that is common to all of the performance sensors. Also, the performance sensor can operate without having any connections to the functional module it is located in.

Figure 5:
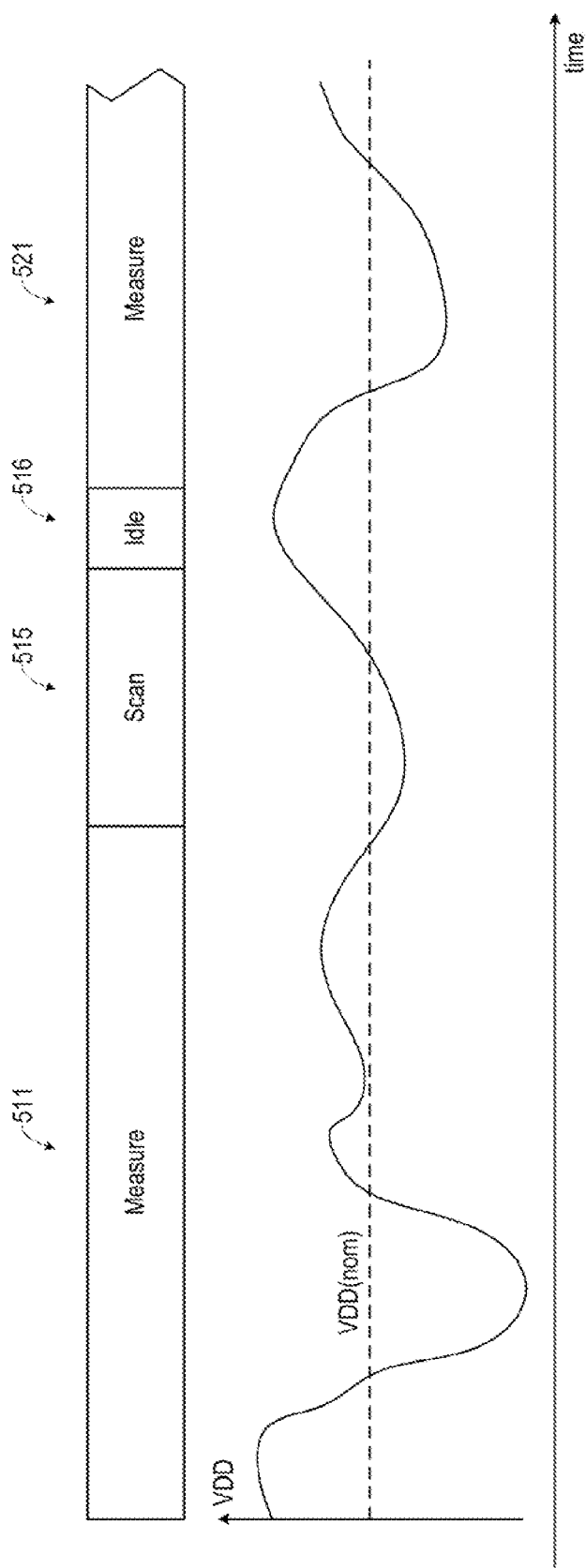
FIG. 5 is a waveform diagram illustrating operation of the system of FIG. 1.

FIG. 5 is a waveform diagram illustrating operation of the system of FIG. 1 which may be implemented using the integrated circuit of FIG. 2 and use the CPR controller module 325 of FIG. 3 and the performance sensor of FIG. 4. In FIG. 5, a CPR measurement-data collection-analysis cycle is shown.

During time interval 511, the performance sensors are measuring performance. For example, counters in the control module 425 can count oscillations of ring oscillators in the measurement module 430 the duration of the measurement period. The measurement time interval 511 may be preceded by a command to the performance sensors, for example, to indicate the type of measurement to be performed. As shown in FIG. 5, the supply voltage VDD may move about its nominal value over time, for example, due to changes in current draws of various circuits that draw current from that supply voltage. By operating the performance sensors over the measurement time interval 511, the measurement provides an average over the voltages of that time interval.

During time interval 515, after the measurements are completed, the measurement results are scanned from the performance sensors to the CPR controller module. As described with reference to FIG. 3, while the measurement results are scanned they are categorized and preprocessed is performed. After the results are scanned, categorized, and preprocessed, the results are analyzed to determine target voltage levels for each supply domain. If the target voltage levels differ from the current voltage levels, the CPR controller module can cause the corresponding changes.

During time interval 516, after the measurements are scanned into the CPR controller and processed, the CPR controller and the performance sensors may remain idle. Another CPR measurement-data collection-analysis cycle then begins with measurement time interval 521.

Figure 6:
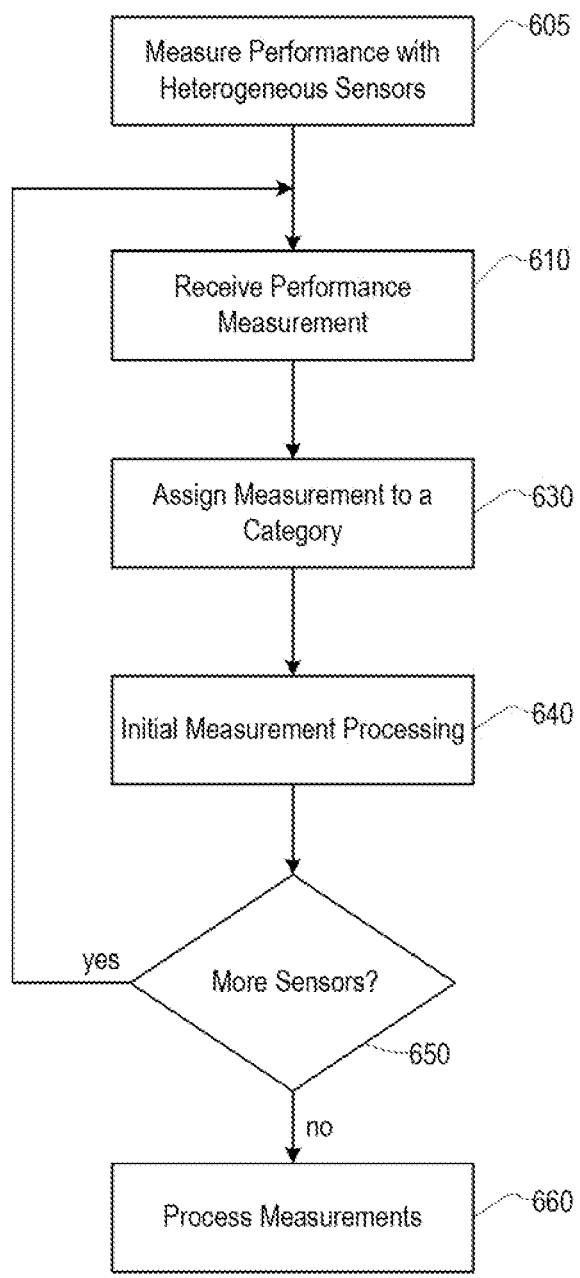
FIG. 6 is a flowchart of a process for multi-domain heterogeneous process-voltage-temperature tracking according to a presently disclosed embodiment.

FIG. 6 is a flowchart of a process for multi-domain heterogeneous process-voltage-temperature tracking according to a presently disclosed embodiment. The process may be performed for each CPR measurement-data collection-analysis cycle. Steps of the process may be, for example, performed using the electronic system of FIG. 1, performed in the integrated circuit of FIG. 2, performed using the CPR controller of FIG. 3, and performed using the performance sensor of FIG. 4.

In step 605, performance sensors measure circuit performance. The performance sensors are located in multiple supply domains and measure heterogeneous types of circuits.

The process sequences through steps 610, 620, and 630 for each performance sensor to sequentially collect performance measurements. In step 610, a performance measurement is received, for example, as the measurement is shifted from the chain of performance sensors. In step 630, the measurement is assigned to a category (bucket). The category may be for a particular supply domain and circuit type. In step 640, the measurement is preprocessed, for example, to keep a running tally of the worst case value for each category. Preprocessing can include masking (excluding from analysis) the measurement.

In step 650, the process checks if there are more measurements to receive, for example, based on comparing a count of measurements received and the number of sensors. If there are more measurements, the process returns to step 610; otherwise, the buckets are processed, in step 660, to determine target voltage levels for the supply domains.

In step 660, the process may evaluate the measurements for each category to determine indicated target voltage levels. For example, the process may compare the worst case value (from step 640) of the performance measurements for each category to a target performance value to determine whether the measurements for that category indicate that the voltage level for the associated supply domain should be increased, decreased, or held at the current value. The target performance values can be chosen based on a desired performance. The target performance values can be different for each category, for example, based on the associated circuit type. The process can then merge the indicated target voltage levels for the categories in each of the supply domains to determine target voltage levels for the supply domains.

The process for multi-domain heterogeneous process-voltage-temperature tracking may be modified, for example, by adding, omitting, reordering, or altering steps. Additionally, steps may be performed concurrently.

Although embodiments of the invention are described above for particular embodiments, many variations of the invention are possible. For example, the numbers of various components may be increased or decreased, modules and steps that determine a supply voltage may be modified to determine a frequency, another system parameter, or a combination of parameters. Additionally, features of the various embodiments may be combined in combinations that differ from those described above.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the invention. In addition, the grouping of functions within a module, block, or step is for ease of description. Specific functions or steps can be moved from one module or block or distributed across to modules or blocks without departing from the invention.

The various illustrative logical blocks and modules described in connection with the embodiments disclosed herein can be implemented or performed with a general purpose processor, a digital signal processor (DSP), application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration.

The steps of a method or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium. An exemplary storage medium can be coupled to the processor such that the processor can read information from, and write information to, the storage medium. In the alternative, the storage medium can be integral to the processor. The processor and the storage medium can reside in an ASIC.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. An integrated circuit, comprising:
    a plurality of performance sensors configured to measure performance of circuitry in the integrated circuit, wherein at least one of the plurality of performance sensors is connected to each of a plurality of supply domains in the integrated circuit; and
    a core power reduction (CPR) controller module coupled to the plurality of performance sensors and configured to
        collect performance measurements from the plurality of performance sensors by sequentially
            receiving the performance measurement from each of the plurality of performance sensors, and
            assigning each of the performance measurements to one of a plurality of categories; and
        process the performance measurements to determine target voltage levels for each of the plurality of supply domains.

2. The integrated circuit of claim 1, wherein the plurality of performance sensors are coupled to the CPR controller module in a scan chain.

3. The integrated circuit of claim 2, wherein the CPR controller module comprises:
    a sensor interface module configured to communicate with the plurality of performance sensors;
    a category identifier/mapping module configured to identify a category of the plurality of categories associated with each of the plurality of performance sensors;
    a measurement preprocessing module configured to produce a category performance measurement for each of the plurality of categories; and
    a CPR processor module configured to process the category performance measurements to determine the target voltage levels each of the plurality of supply domains.

4. The integrated circuit of claim 2, wherein the scan chain includes a bypass for at least one block of the plurality of performance sensors.

5. The integrated circuit of claim 1, wherein the plurality of performance sensors include sensors for heterogeneous circuits that have different relationships between supply voltage and circuit speed.

6. The integrated circuit of claim 5, wherein the heterogeneous circuits include circuits using different transistor types.

7. The integrated circuit of claim 5, wherein the heterogeneous circuits include circuits using different cell libraries.

8. The integrated circuit of claim 1, wherein the plurality of categories include a category for each of the plurality of supply domains.

9. The integrated circuit of claim 8, wherein the plurality of performance sensors include sensors for heterogeneous circuits that have different relationships between supply voltage and circuit speed, and wherein the plurality of categories further include a category for each type of heterogeneous circuit.

10. An integrated circuit, comprising:
a plurality of performance sensors configured to measure performance of circuitry in the integrated circuit, wherein the plurality of performance sensors are connected to at least one supply domain in the integrated circuit, and wherein the plurality of performance sensors include sensors for heterogeneous circuits that have different relationships between supply voltage and circuit speed; and
a core power reduction (CPR) controller module coupled to the plurality of performance sensors and configured to
collect performance measurements from the plurality of performance sensors by sequentially
receiving the performance measurement from each of the plurality of performance sensors, and
assigning each of the performance measurements to one of a plurality of categories according to a circuit type associated with the corresponding performance measurement; and
process the performance measurements to determine a target voltage level for the at least one supply domain.

11. The integrated circuit of claim 10, wherein the plurality of performance sensors are coupled to the CPR controller module in a scan chain.

12. The integrated circuit of claim 11, wherein the CPR controller module comprises:
a sensor interface module configured to communicate with the plurality of performance sensors;
a category identifier/mapping module configured to identify a category of the plurality of categories associated with each of the plurality of performance sensors;
a measurement preprocessing module configured to produce a category performance measurement for each of the plurality of categories; and
a CPR processor module configured to process the category performance measurements to determine the target voltage level for the at least one supply domain.

13. The integrated circuit of claim 12, wherein the plurality of categories include a category for each type of heterogeneous circuit, and wherein the CPR processor module is further configured to merge the category performance measurements for use in determining the target voltage level for the at least one supply domain.

14. The integrated circuit of claim 11, wherein the scan chain includes a bypass for at least one block of the plurality of performance sensors.

15. The integrated circuit of claim 10, wherein the heterogeneous circuits include circuits using different transistor types.

16. The integrated circuit of claim 10, wherein the heterogeneous circuits include circuits using different cell libraries.

17. A method for use in controlling supply voltages for multiple supply domains to reduce power in an integrated circuit, the method including:
measuring circuit performance in the multiple supply domains using a plurality of heterogeneous performance sensors;
collecting performance measurements by sequentially
receiving the performance measurement from each of the plurality of heterogeneous performance sensors, and
assigning each of the performance measurements to one of a plurality of categories according to a circuit type and supply domain associated with the corresponding performance measurement; and
processing the performance measurements to determine target levels for the supply voltages.

18. The method of claim 17, wherein the heterogeneous performance sensors measure the performance of different circuit types that have different relationships between supply voltage and circuit speed.

19. The method of claim 18, wherein the different circuit types include circuits using different transistor types.

20. The method of claim 18, wherein the different circuit types include circuits using different cell libraries.

21. The method of claim 18, wherein the plurality of categories include a category for each of the different circuit types.

22. The method of claim 17, wherein the plurality of categories include a category for each of the multiple supply domains.

23. The method of claim 17, wherein collecting the performance measurements includes preprocessing of the performance measurements to produce a category performance measurement for each of the plurality of categories while sequential receiving the performance measurements, and wherein processing the performance measurements to determine target levels for the supply voltages includes merging the category performance measurements associated with a respective one of the multiple supply domains.

24. The method of claim 23, wherein the category performance measurements include a worst-case measurement of the performance measurements for the respective one of the plurality of categories.

25. The method of claim 17, wherein processing the performance measurements is performed using multi-threaded processing.

26. An apparatus, comprising:
a plurality of means for sensing performance of circuitry in an integrated circuit, wherein at least one of the plurality of means for sensing performance is connected to each of a plurality of supply domains in the integrated circuit, and wherein the plurality of means for sensing performance include sensors for heterogeneous circuits that have different relationships between supply voltage and circuit speed; and
a means for controlling voltages of the plurality of supply domains configured to
collect performance measurements from the plurality of means for sensing performance by sequentially
receiving the performance measurement from each of the plurality of means for sensing performance, and
assigning each of the performance measurements to one of a plurality of categories according to a circuit type and supply domain associated with the corresponding performance measurement; and
process the performance measurements to determine a target voltage level for each of the plurality of supply domains.

27. The apparatus of claim 26, wherein the plurality of means for sensing performance are coupled to the means for controlling voltages in a scan chain.

28. The apparatus of claim 27, wherein the means for controlling voltages comprises:
- a sensor interface module configured to communicate with the plurality of means for sensing performance;
- a category identifier/mapping module configured to identify a category of the plurality of categories associated with each of the plurality of means for sensing performance;
- a measurement preprocessing module configured to produce a category performance measurement for each of the plurality of categories; and
- a processor module configured to process the category performance measurements to determine the target voltage levels each of the plurality of supply domains.

29. The apparatus of claim 26, wherein the heterogeneous circuits include circuits using different transistor types and circuits using different cell libraries.

30. The apparatus of claim 26, wherein the plurality of categories include a category for each of the plurality of supply domains and a category for each type of heterogeneous circuit.

* * * * *